United States Patent
Ikeda

(10) Patent No.: US 9,287,088 B2
(45) Date of Patent: Mar. 15, 2016

(54) SEMICONDUCTOR CIRCUIT

(71) Applicant: KABUSHIKI KAISHA TOSHIBA, Tokyo (JP)

(72) Inventor: Takahiro Ikeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 14/174,718

(22) Filed: Feb. 6, 2014

(65) Prior Publication Data
US 2015/0060661 A1    Mar. 5, 2015

(30) Foreign Application Priority Data
Aug. 30, 2013    (JP) .................................. 2013-180138

(51) Int. Cl.
*H01J 37/00*    (2006.01)
*H01J 37/28*    (2006.01)

(52) U.S. Cl.
CPC ........... *H01J 37/28* (2013.01); *H01J 2237/226* (2013.01); *H01J 2237/2611* (2013.01)

(58) Field of Classification Search
CPC ................ H01J 37/28; H01J 2237/226; H01J 2237/2611
USPC .................................. 250/306, 307, 310, 311
See application file for complete search history.

(56) References Cited

U.S. PATENT DOCUMENTS

| | | | | |
|---|---|---|---|---|
| 6,172,363 | B1 * | 1/2001 | Shinada ............... | G01R 31/305 250/307 |
| 7,528,614 | B2 * | 5/2009 | Bullock ................. | G01N 23/20 324/754.23 |
| 7,880,143 | B2 * | 2/2011 | Tanimoto .............. | H01J 37/244 250/306 |
| 7,969,582 | B2 | 6/2011 | Fujii | |
| 8,421,008 | B2 * | 4/2013 | Nozoe ................... | H01J 37/244 250/306 |
| 2003/0071213 | A1 | 4/2003 | Ikeda | |

FOREIGN PATENT DOCUMENTS

| JP | H08329875 | 12/1996 |
|---|---|---|
| JP | 2003-100828 A | 4/2003 |
| JP | 2005-321278 A | 11/2005 |
| JP | 2007-010354 | 1/2007 |
| JP | 2010-085376 A | 4/2010 |

\* cited by examiner

*Primary Examiner* — Michael Maskell
(74) *Attorney, Agent, or Firm* — Patterson & Sheridan, LLP

(57) ABSTRACT

An inspection device includes first and second electro-optical systems, a first detector, and a shape calculation unit. The first electro-optical system irradiates an object to be inspected with a first electron beam to cause an irradiation mark to be placed on the object to be inspected. The second electro-optical system irradiates the object to be inspected with a second electron beam. The first detector detects a secondary electron generated from the object to be inspected in response to the irradiation by the second electron beam, and outputs a first signal based on the irradiation mark. The shape calculation unit calculates a three-dimensional shape of the object to be inspected based on the first signal, an irradiation direction of the first electron beam, and an irradiation direction of the second electron beam.

20 Claims, 15 Drawing Sheets

$$\phi_3 - \phi_2 = F(n_1, n_2, n_3)$$

SEMICONDUCTOR CIRCUIT

CROSS-REFERENCE TO RELATED APPLICATION

This application is based upon and claims the benefit of priority from Japanese Patent Application No. 2013-180138, filed Aug. 30, 2013, the entire contents of which are incorporated herein by reference.

FIELD

Embodiments described herein relate to an inspection device and an inspection method.

BACKGROUND

To enhance the integration density of a semiconductor integrated circuit, it may be necessary to inspect fine and complicated pattern shapes formed therein.

However, the acquisition of a three-dimensional shape by cross-sectional observation using a transparent electron microscope (TEM) or the like is very expensive during working of a sample and observation of the sample.

Further, in the three-dimensional measurement using light, a size of an object to be observed is limited due to wavelength limitations of light. For example, it is difficult to observe a shape on a nanometer scale using light.

On the other hand, an image acquired by a scanning electron microscope (SEM), referred to as a shape contrast, contains information relating to a three-dimensional shape and hence, a method where a three-dimensional shape is reconstructed by making use of the shape contrast has been proposed.

However, a density distribution, which is two-dimensional information, contains a factor which affects density but not the shape contrast, thus giving rise to a drawback that results of inspection contain uncertainty.

DETAILED DESCRIPTION

Figure 1:
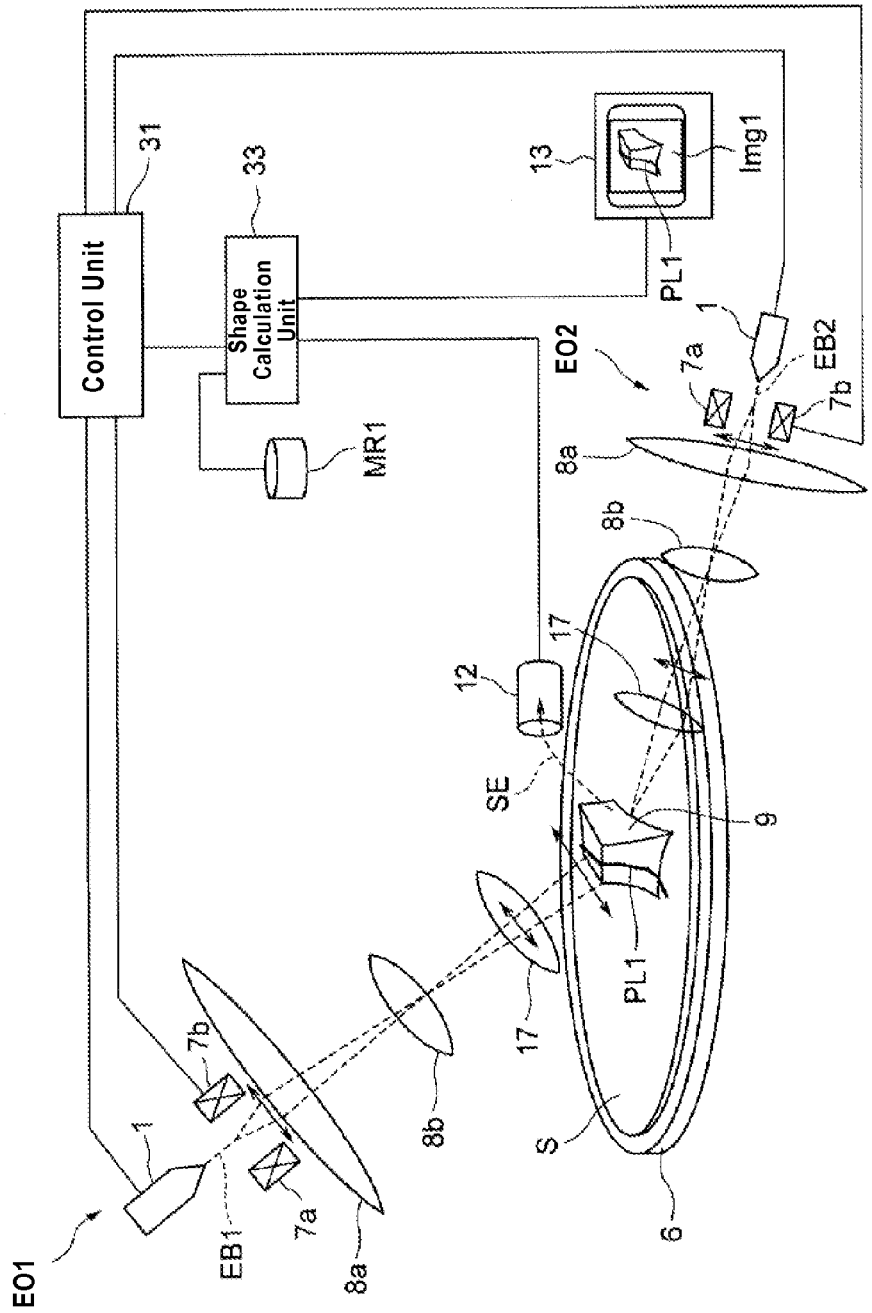
FIG. 1 is a block diagram depicting an inspection device according to a first embodiment.

Embodiments provide an inspection device and an inspection method by which a shape inspection of high spatial resolution can be performed with high reliability.

In general, according to one embodiment, an inspection device includes first and second electro-optical systems, a first detector, and a shape calculation unit. The first electro-optical system irradiates an object to be inspected with a first electron beam to cause an irradiation mark to be placed on the object to be inspected. The second electro-optical system irradiates the object to be inspected with a second electron beam. The first detector detects a secondary electron generated from the object to be inspected in response to the irradiation by the second electron beam, and outputs a first signal based on the irradiation mark. The shape calculation unit calculates a three-dimensional shape of the object to be inspected based on the first signal, an irradiation direction of the first electron beam, and an irradiation direction of the second electron beam.

Embodiments are explained in conjunction with the attached drawings. In the drawings, same numerals are given to identical elements and repeated explanation of these elements is omitted.

(A) Inspection Device

(1) First Embodiment

FIG. 1 is a block diagram depicting an inspection device according to a first embodiment. The inspection device according to the first embodiment includes: a stage 6; an electro-optical system EO1; an electro-optical system EO2; a secondary electron detector 12; a control unit 31; a shape calculation unit 33; and a monitor 13.

The stage 6 holds a substrate S on which an object to be inspected 9 is mounted, and the stage 6 is movable in the X, Y and Z directions and in the rotational directions by being driven by drive mechanisms such as actuators not shown in the drawing.

The control unit 31 is connected to the electro-optical systems EO1, EO2 and the shape calculation unit 33, generates various control signals, and controls these elements based on the control signals. The electro-optical systems EO1, EO2, the stage 6 and the secondary electron detector 12 are accommodated in a vacuum chamber not shown in FIG. 1 (see FIG. 5). A vacuum pump not shown in the drawing is connected to the vacuum chamber, and a vacuum is created in the vacuum chamber, and the inspection is performed within a chamber that is in a high vacuum state.

Both electro-optical systems EO1, EO2 include an electron gun 1; deflector coils 7*a*, 7*b*, electromagnetic lenses 8*a*, 8*b* and an objective lens 17 respectively. In response to a control signal from the control unit 31, the electron guns 1 generate electron beams EB1, EB2 and irradiate the object to be inspected 9 with the electron beams EB1, EB2. The electromagnetic lenses 8a, 8b adjust beam fluxes of the respective electron beams EB1, EB2 from the electron guns 1. The objective lenses 17 adjust focal lengths of the respective electron beams EB1, EB2 and make the respective electron beams EB1, EB2 incident on the object to be inspected 9 by focusing. The deflector coils 7a, 7b are connected to the control unit 31, and in response to a control signal from the control unit 31, the deflector coils 7a, 7b deflect the electron beams EB1, EB2 thus enabling scanning of desired regions of the object to be inspected 9 by the electron beams EB1, EB2. In this embodiment, the electro-optical system EO1 and the electro-optical system EO2 correspond to the first and second optical systems respectively, for example, and the electron beams EB1, EB2 correspond to the first and second electron beams respectively, for example.

The secondary electron detector 12 detects a secondary electron SE emitted from the object to be inspected 9 due to the irradiation of an electron beam EB2, and outputs a signal to the shape calculation unit 33. The shape calculation unit 33 acquires an SEM image of the object to be inspected 9 by processing the signal transmitted from the secondary electron detector 12 and displays the SEM image on the monitor 13, and also calculates a three-dimensional shape of the object to be inspected 9 by processing the signal from the secondary electron detector 12. The result of calculation is stored in a memory MR1. In this embodiment, the secondary electron detector 12 corresponds to the first detector, for example.

Figure 2:
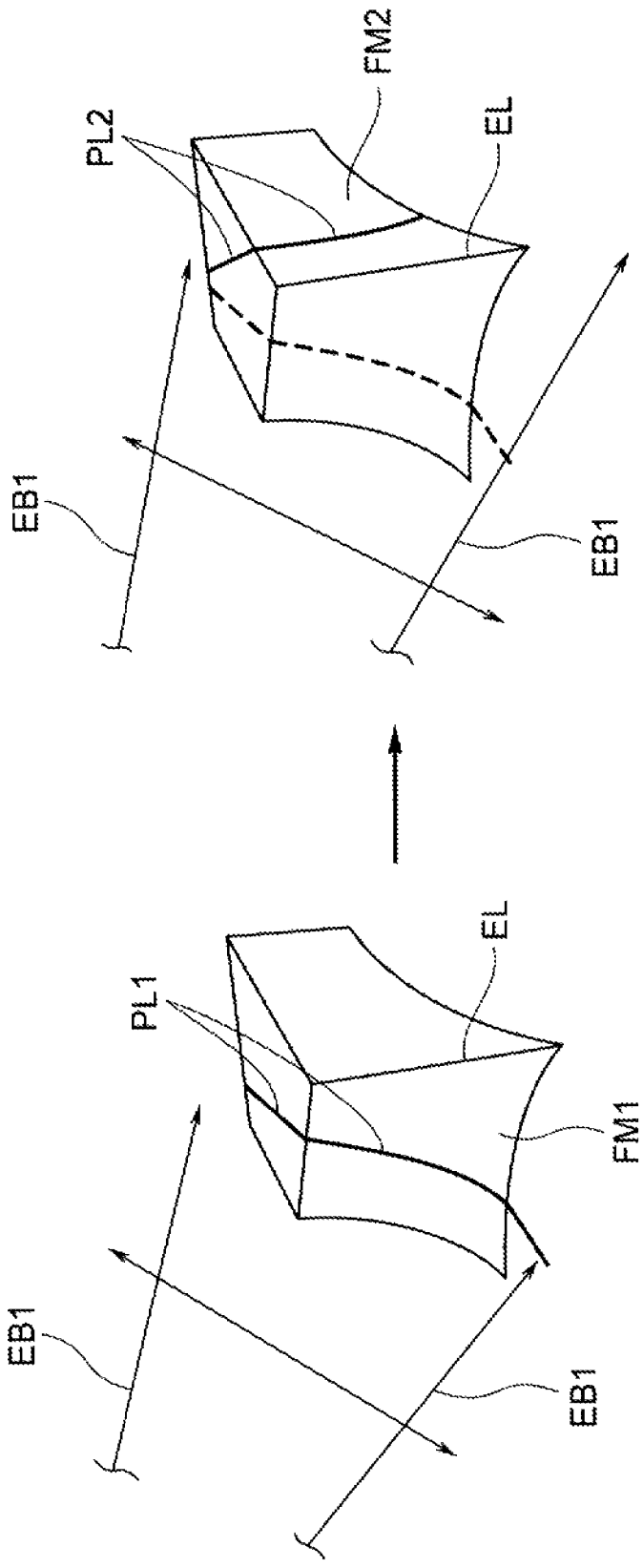
FIG. 2 is a view illustrating an example where an irradiation mark moves during the inspection performed by the inspection device shown in FIG. 1.

The manner of operation of the inspection device shown in FIG. 1 is explained in conjunction with FIG. 2.

In response to a control signal transmitted from the control unit 31, the electron gun 1 of the electro-optical system EO1 irradiates the object to be inspected 9 with an electron beam EB1. Here, a control signal is supplied to the deflector coils 7a, 7b from the control unit 31 such that the irradiation position of the electron beam EB1 in the direction horizontal to a surface of the substrate S (hereinafter simply referred to as "horizontal direction") is fixed, and scanning in a reciprocating manner is performed in the direction perpendicular to the surface of the substrate S (hereinafter simply referred to as "vertical direction"). Due to such linear beam scanning (hereinafter referred to as "line scanning"), a mark indicating the irradiation of an electron beam (hereinafter referred to as "irradiation mark") is generated on a portion of the object to be inspected 9 which is irradiated with the electron beam EB1. Without delay after the irradiation of the electron beam EB1 or almost simultaneously with the irradiation of the electron beam EB1, the electro-optical system EO2 irradiates the object to be inspected 9 with an electron beam EB2 in response to a control signal from the control unit 31 thus performing surface scanning of the portion of the object to be inspected 9 which is irradiated with the electron beam EB1 so as to observe the irradiation mark generated by the electron beam EB1.

Such an irradiation mark is generated due to the following reasons. The mark is selectively generated at the portion which is irradiated with the electron beam EB1 or the difference in charged state is generated between an irradiated portion and a non-irradiated portion of the object to be inspected 9 due to an incident voltage of the electron beam EB1 and such difference appears as a charge contrast observed by the electro-optical system EO2. Alternatively, a secondary electron generated by the irradiation of the electron beam EB1 is mixed into the secondary electron detector 12 so that a phenomenon where a bright line of a portion of the object to be inspected 9 becomes brighter than bright lines of other portions of the object to be inspected 9 is observed in an SEM image Img1.

As shown in FIG. 1, in an SEM image Img1, the above-mentioned fetched irradiation mark appears as a polyline PL1 which changes the inclination thereof in accordance with an angle which is made by the normal direction of a surface element which constitutes the object to be inspected 9 on a two-dimensional plane and the observation direction of the electro-optical system EO2. The shape calculation unit 33 calculates which direction the surface element is directed with respect to the observation direction by analyzing the polyline PL1.

Next, the control unit 31 performs a control such that the observation of the irradiation mark and the analysis of the polyline are repeatedly performed by the electro-optical system EO2, the secondary electron detector 12 and the shape calculation unit 33 while shifting the position of reciprocating scanning by the electron beam EB1. For example, as shown in FIG. 2, when the electron beam EB1 is shifted in the horizontal direction so that the electron beam EB1 goes beyond a ridge line EL of the object to be inspected 9 from a surface element FM1 to which an irradiation mark PL1 is given and moves to a surface element FM2 adjacent to the surface element FM1, an irradiation mark PL2 is captured in the SEM image Img1 by which the facing direction of the surface element FM2 with respect to the observation direction can be calculated by the shape calculation unit 33. It is possible to reconstruct a three-dimensional shape of the object to be inspected 9 by repeating the above-mentioned steps while moving the stage 6 in the rotating direction.

The method according to this embodiment is explained hereinafter where a facing direction of a surface of the object to be inspected 9 is calculated by the shape calculation unit 33 based on the irradiation direction of an electron beam EB1, the observation direction using an electron beam EB2 and the result of observation of an irradiation mark on a surface of the object to be inspected 9.

Figure 10A:
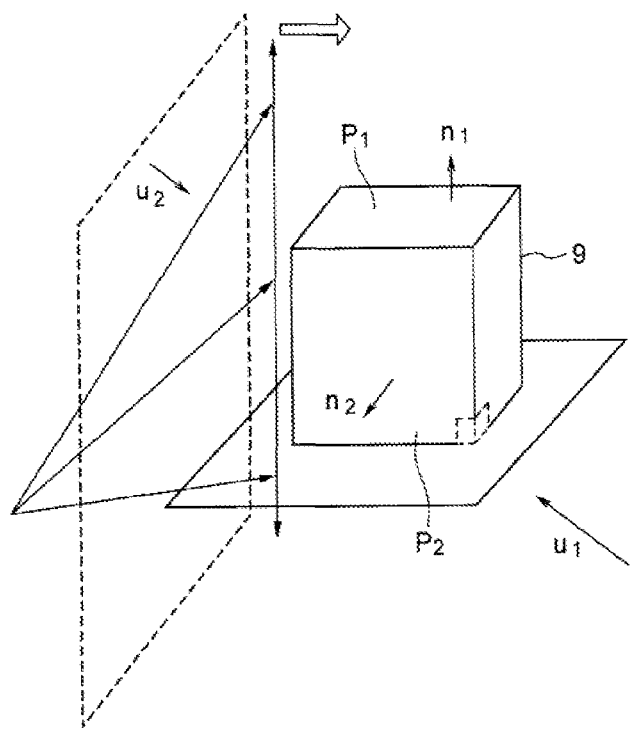
FIG. 10A and FIG. 10B are views for explaining a method of calculating a facing direction of a surface of an object to be inspected by the inspection device shown in FIG. 1.

Firstly, as the simplest case, the case shown in FIG. 10A is considered where the object to be inspected 9 is a rectangular parallelepiped body. In FIG. 10A, a vector $u_2$ is a vector (normal vector) which is orthogonal to a plane formed by the irradiation direction of an electron beam EB1. When the irradiation direction of the electron beam EB1 is determined, the vector $u_2$ is unequivocally determined. A vector $u_1$ is a vector which coincides with the observation direction using an electron beam EB2, a vector $n_1$ is a normal vector of an upper surface $P_1$ of the object to be inspected 9, and a vector $n_2$ is a normal vector of a front surface $P_2$ of the object to be inspected 9.

Figure 10B:
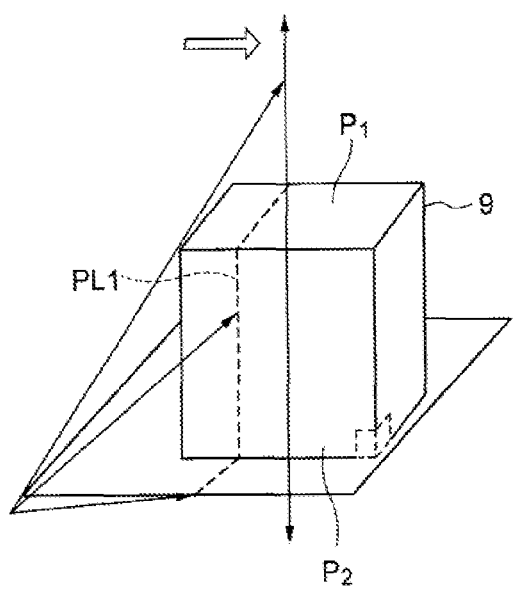
Figure 11A:
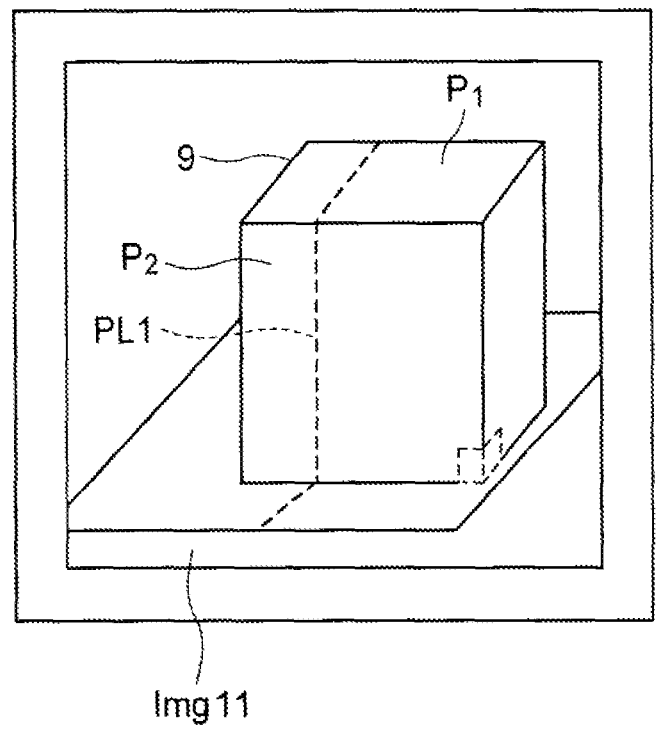
FIG. 11A and FIG. 11B are views for explaining a method of calculating a facing direction of a surface of an object to be inspected by the inspection device shown in FIG. 1.
Figure 11B:
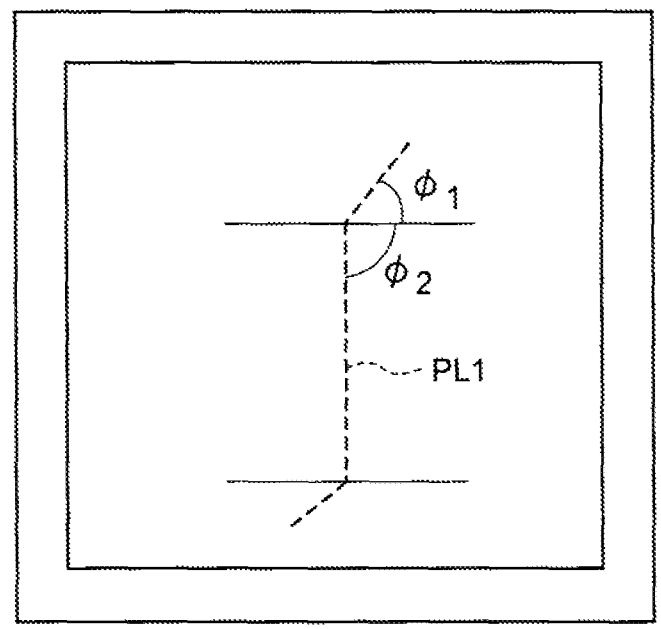

As shown in FIG. 10B, when an object is irradiated with an electron beam EB1 by line scanning, an irradiation mark (charge mark) PL1 is generated. When the irradiation mark PL1 is imaged by the electro-optical system EO2, a polyline pattern in the form of a two-dimensional grayscale image appears as indicated by an image Img 11 shown in FIG. 11A. To take out only a grayscale signal due to the irradiation mark PL1 from the image Img 11, an image shown in FIG. 11B is acquired. From the image shown in FIG. 11B, it is possible to read out a direction angle $\phi_1$ of a portion of the irradiation mark PL1 which is on the upper surface $P_1$ of the object to be inspected 9 and a direction angle $\phi_2$ of a portion of the irradiation mark PL1 which is on the front surface $P_2$ of the object to be inspected 9 with reference to a horizontal line in the image. Given these two angles $\phi_1$, $\phi_2$ and vectors $n_1$, $n_2$, an angle made by the upper surface $P_1$ and the front surface $P_2$, that is, a facing direction of the front surface $P_2$ with respect to the upper surface $P_1$ can be determined geometrically.

Figure 12A:
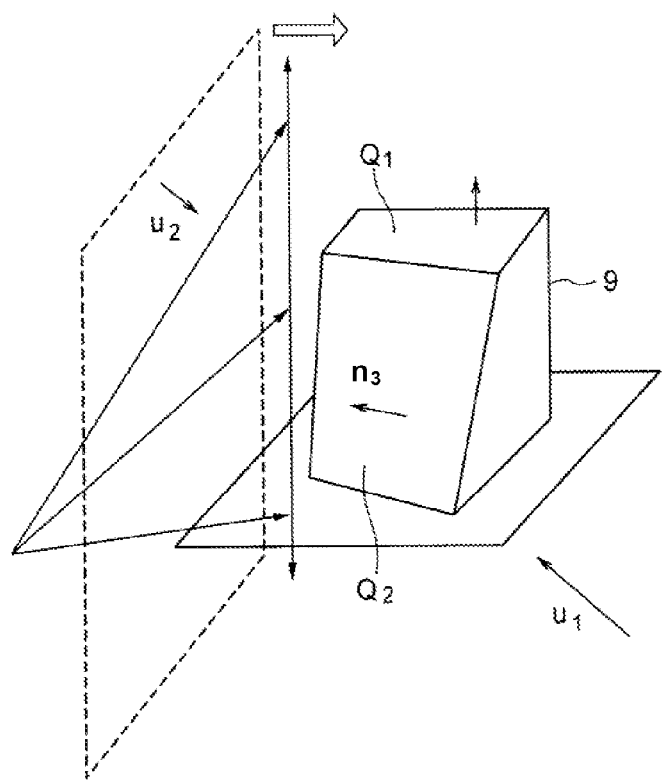
FIG. 12A and FIG. 12B are views for explaining a method of calculating a facing direction of a surface of an object to be inspected by the inspection device shown in FIG. 1.
Figure 12B:
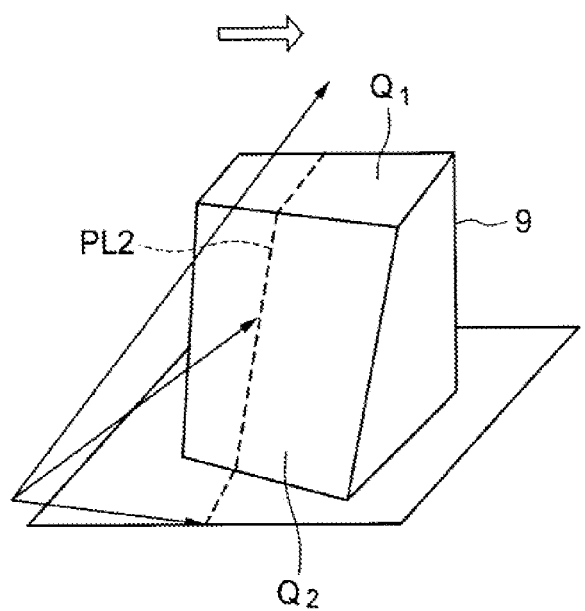
Figure 13A:
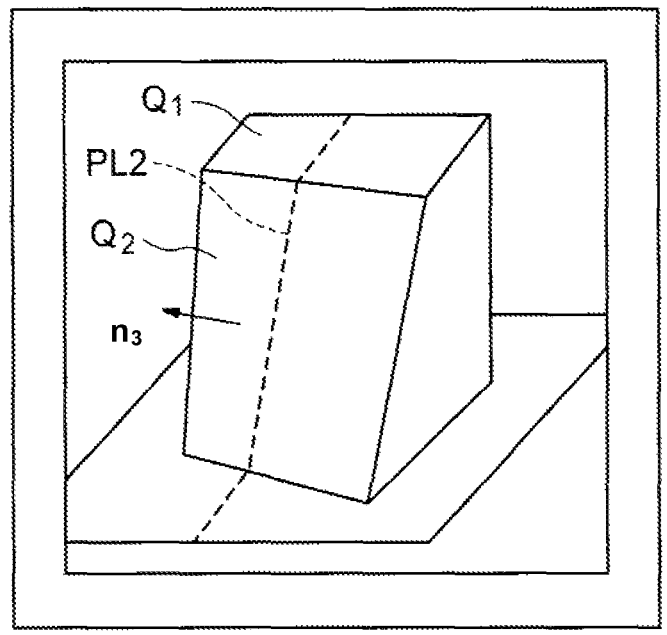
FIG. 13A and FIG. 13B are views for explaining a method of calculating a facing direction of a surface of an object to be inspected by the inspection device shown in FIG. 1.
Figure 13B:
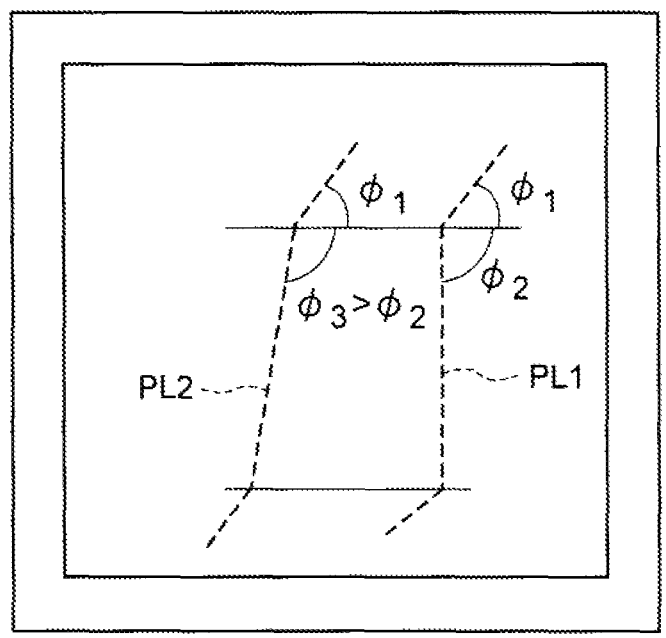

Next, a method of calculating a facing direction with respect to a more general shape is explained in conjunction with FIGS. 12A and 12B and FIGS. 13A and 13B. Assuming an upper surface of an object to be inspected 9 as $Q_1$ and a surface of the object to be inspected 9 adjacent to the upper surface $Q_1$ as $Q_2$, a charge mark when line scanning is performed as shown in FIG. 12A is set as an irradiation mark PL2 (see FIG. 12B). As shown in FIG. 13A, in this embodiment, the surface $Q_1$ and the surface $Q_2$ make an obtuse angle therebetween. Accordingly, to obtain direction angles $\phi_1$, $\phi_2$, $\phi_3$ of the irradiation mark PL2 on the surface $Q_1$ and the surface $Q_2$ acquired in accordance with the process substantially the same as the process shown in FIG. 11A and FIG. 11B, the relationship between the direction angles $\phi_2$, $\phi_3$ is set to $\phi_3 > \phi_2$, as shown in FIG. 13B. It is apparent that the difference between the direction angle $\phi_3$ and the direction angle $\phi_2$ is caused by the difference between an angle made by the upper surface $P_1$ and the front surface $P_2$ and an angle made by the surfaces $Q_1$, $Q_2$ or is caused by the difference in facing direction between the front surface $P_2$ (FIG. 11A) and the front surface $Q_2$ (FIG. 12A) when the upper surface $P_1$ (FIG. 11A) and the upper surface $Q_1$ (FIG. 12A) are aligned with each other.

Figure 14A:
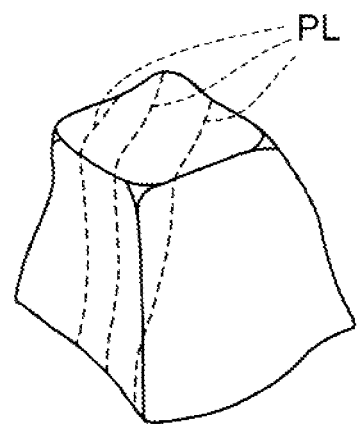
FIG. 14A to FIG. 14D are views for explaining a method of calculating a facing direction of a surface of an object to be inspected by the inspection device shown in FIG. 1.
Figure 14B:
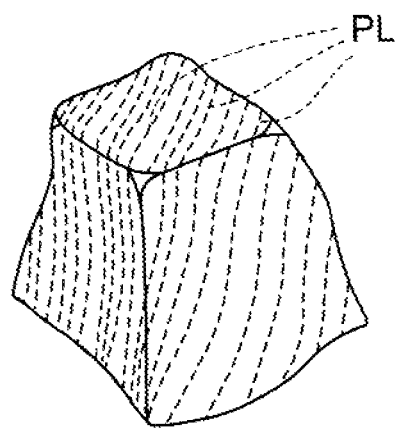
Figure 14C:
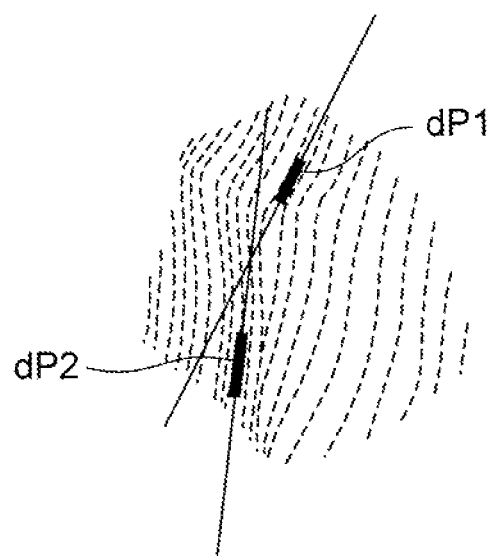
Figure 14D:
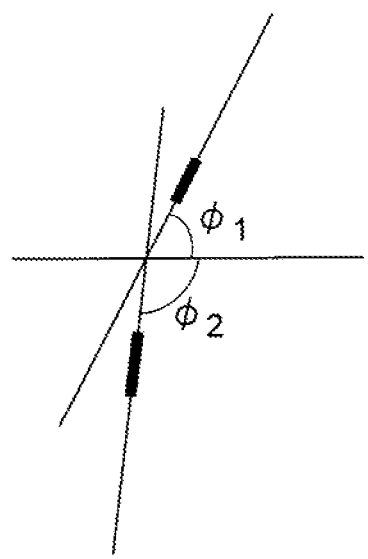

FIGS. 14A to 14D show a case where a method of calculating a facing direction similar to the above-mentioned method is applied to a more complicated shape. Broken lines shown in FIG. 14A and FIG. 14B indicate irradiation marks (charge marks) PL which are successively generated when a scanning position moves in the lateral direction. FIG. 14A shows the case where such an operation is applied to three portions of an object to be inspected 9, while FIG. 14B shows the case where such an operation is applied to the whole object to be inspected 9 at equal intervals. These shapes are observed by the electron optical system EO2 and are converted into two-dimensional grayscale images, and only portions of the images due to the irradiation marks (charge marks) PL are extracted so as to form an image shown in FIG. 14C. Assume a direction of a portion dP1 of the irradiation mark (charge mark) in FIG. 14C as $\phi_1$ (FIG. 14D). This direction $\phi_1$ is acquired as the tangential direction of the curved irradiation mark (charge mark). By setting this dP1 as the reference in determining the facing direction, the facing direction at a desired place dP2 can be acquired in accordance with steps similar to the steps explained in conjunction with FIGS. 10A and 10B and FIGS. 11A and 11B.

According to the inspection device of this embodiment, a facing direction of an object to be inspected 9 can be identified based on only the geometrical relationship between an irradiation mark and the observation direction of the electro-optical system EO2 and hence, it is possible to perform the shape inspection of high spatial resolution with high reliability.

(2) Second Embodiment

Figure 3:
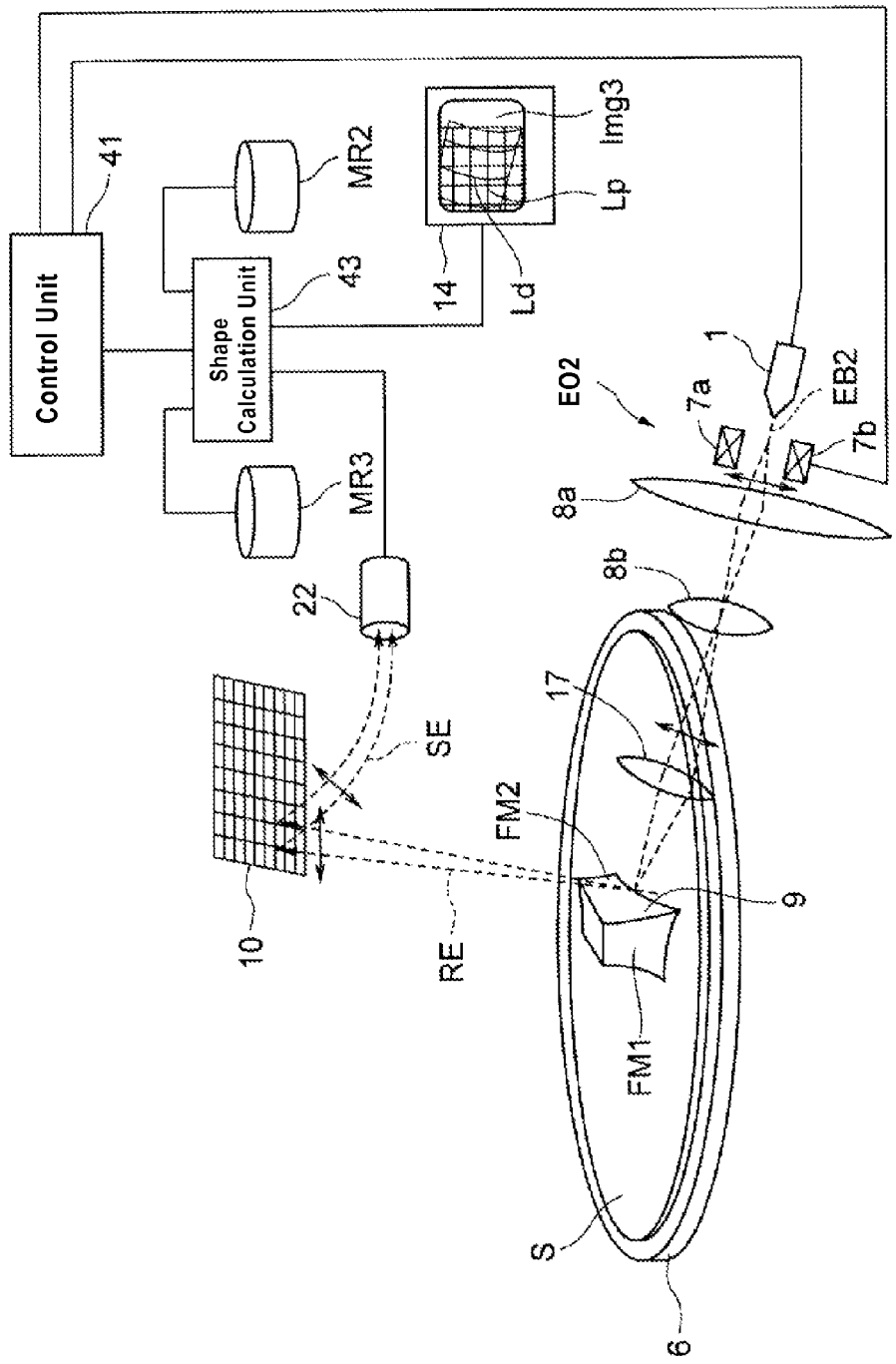
FIG. 3 is a block diagram depicting an inspection device according to a second embodiment.

FIG. 3 is a block diagram depicting an inspection device according to the second embodiment. The inspection device of this embodiment includes: a control unit 41; a secondary electron detector 22; a shape calculation unit 43; a monitor 14; and a secondary electron generating member 10 which characterizes this embodiment besides a stage 6 and an electro-optical system EO2 described similar to the stage 6 and the electro-optical system EO2 of the above-mentioned first embodiment. In this embodiment, the electro-optical system EO2 corresponds to a first electro-optical system, for example.

The control unit 41 is connected to the electro-optical system EO2 and the shape calculation unit 33, generates various control signals, and controls these elements based on the control signals. The electro-optical system EO2, the stage 6 and the secondary electron detector 22 are accommodated in a vacuum chamber not shown in FIG. 3 (see FIG. 5). A vacuum pump not shown in the drawing is connected to the vacuum chamber, and a vacuum is created in the vacuum chamber, and the inspection is performed in a high vacuum state.

The secondary electron generating member 10 is formed in a regular lattice pattern in this embodiment. The secondary electron generating member 10 emits a secondary electron SE upon reception of the incidence of an electron which is formed when an electron beam EB2 emitted from the electron optical system EO2 is reflected on a surface element of an object to be inspected 9 (hereinafter, referred to as "reflection electron"). An objective lens 17 of the electron optical system EO2 has a focal position thereof adjusted such that a reflection electron RE from the object to be inspected 9 is just focused on an inspection surface of the secondary electron generating member 10. In this embodiment, the electron beam EB2 corresponds to a first electron beam, for example.

The secondary electron detector 22 is connected to the shape calculation unit 43. The secondary electron detector 22 detects a secondary electron SE from the secondary electron generating member 10, and outputs a signal and transmits the outputted signal to the shape calculation unit 43. In this embodiment, the signal outputted from the secondary electron detector 22 corresponds to the first signal, for example.

The shape calculation unit 43 acquires a lattice image Img3 by processing a signal transmitted from the secondary electron detector 22, and calculates a three-dimensional shape of the object to be inspected 9 by calculating an amount of distortion in the lattice image Img3. The result of calculation is displayed on the monitor 14 and is stored in a memory MR3.

The manner of operation of the inspection device shown in FIG. 3 is explained hereinafter.

Figure 4A:
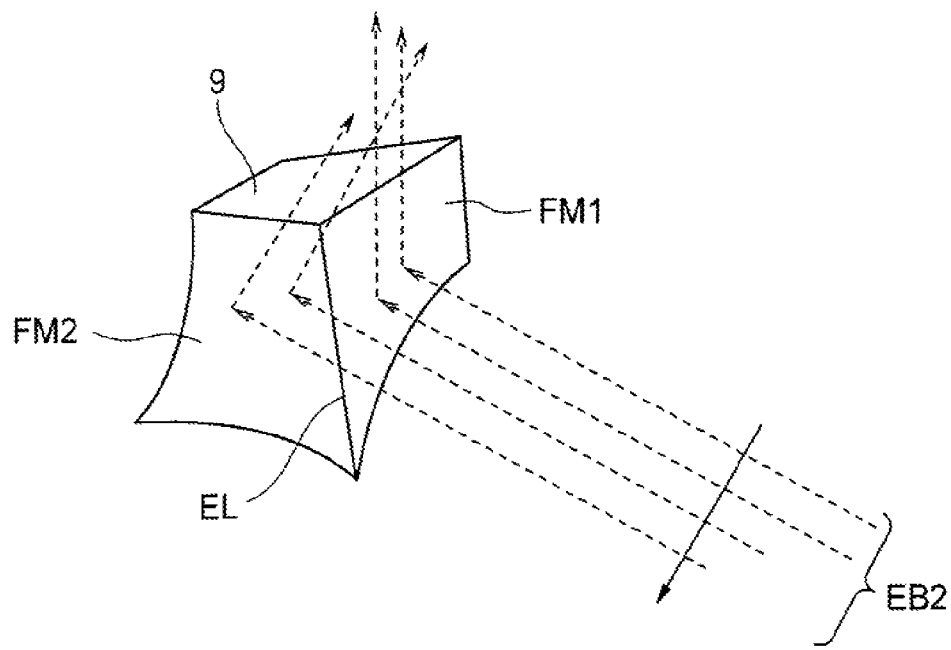
FIG. 4A and FIG. 4B are views for explaining the relationship between beam scanning and a lattice image during the inspection performed by the inspection device shown in FIG. 3.
Figure 4B:
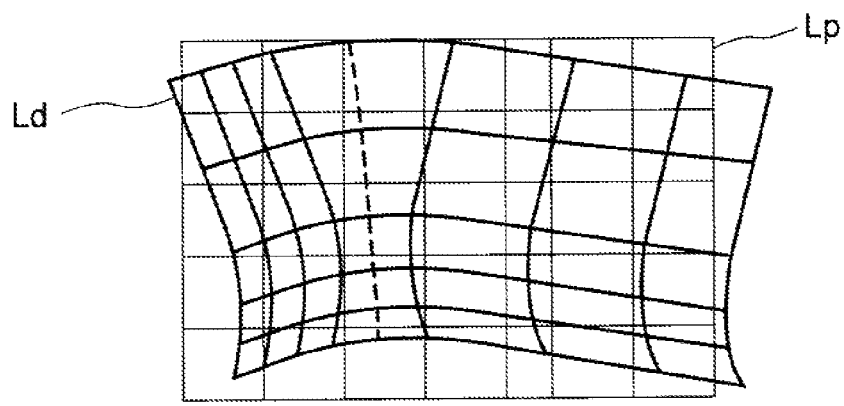

An electron beam EB2 which is generated by an electron gun 1 in response to a control signal from the control unit 41 and is emitted toward the object to be inspected 9, is scanned by deflector coils 7a, 8b. Accordingly, surface scanning is performed with respect to respective surface elements of the object to be inspected 9. The electron beam EB2 is subjected to specular reflection by the surface element of the object to be inspected 9, is incident on an inspection surface of the secondary electron generating member 10 as a reflection electron RE, and a secondary electron SE is emitted from the detection surface of the secondary electron generating member 10. The emitted secondary electron SE is inspected by the secondary electron detector 22 and is converted into an electric signal, and the electric signal is transmitted to the shape calculation unit 43. The shape calculation unit 43 forms an image by processing the signal transmitted from the secondary electron detector 22, and the image is displayed on the monitor 14 in synchronism with the operation of the deflector coils 7a, 7b. Accordingly, a lattice image Img3, which is formed on the detection surface of the secondary electron generating member 10 according to a principle that is substantially the same as a principle of forming an SEM image with a typical scanning electron microscope, is displayed. For example, as shown in FIG. 4A, when an electron beam EB2 goes beyond a ridge line EL of the object to be inspected 9 from a surface element FM1 along with the progress of surface scanning, and the electron beam EB2 moves to a surface element FM2 arranged adjacent to the surface element FM1, as shown in FIG. 4B, a distortion in the direction opposite to the direction of the distortion generated by a reflection electron RE from the surface element FM1, is included in the lattice image Img3. In this embodiment, the lattice image Img3 corresponds to a first lattice image, for example.

When a surface element of the object to be inspected 9 is flat and a defect such as a foreign substance does not exist on the surface element, a lattice image having no distortion is formed. However, as shown in FIG. 3 and FIG. 4A, when a surface of a surface element on which an electron beam EB2 is incident has a gradient depending on a three-dimensional shape of the object to be inspected 9, a reflection electron RE emitted from a portion having the gradient has an emission direction which is deviated compared to the case where a reflection electron RE is reflected on a flat portion, and an acquired lattice image is distorted as indicated by symbol Ld from an original lattice image Lp in a lattice image Img3 shown in FIG. 3.

The shape calculation unit 43 calculates the deviation of a landing position of a reflection electron RE whose emission direction is deviated due to a gradient of a surface element on a detection surface of the secondary electron generating member 10 using the principle of an optical lever, and calculates an amount of distortion of a lattice image Img3 by backward calculation. By reconstructing the facing direction of a surface element with respect to the direction of an incident electron based on information on an acquired amount of distortion, it is possible to reconstruct a stereoscopic shape of the objected to be inspected 9.

Secondary Electron Generating Member

As a method for forming the secondary electron generating member 10, a lattice-shaped photomask is formed on a flat substrate by photolithography, and a lattice pattern is formed by selectively removing the substrate by etching. A flat substrate made of crystalline silicon, for example, may be used as the substrate. As a photomask, a transparent sheet on which square lattice of approximately 0.1 mm, for example, is printed is used. The photomask is formed by a reduction projection exposure method to a photosensitive body using a simple projection exposure device. As etching, it is possible to use wet etching which uses an aqueous solution containing tetra methyl ammonium hydroxide (TMAH) or an aqueous solution containing a fluoric acid and nitric acid, for example. Accordingly, it is possible to form a regular grid pattern having lattice intervals of approximately 0.1 mm in the longitudinal direction as well as in the lateral direction is formed on the flat substrate, for example.

With respect to a material of the substrate for forming the secondary electron generating member 10, it is sufficient to use a material which is substantially flat. It is possible to use metal having the large atomic number or a compound of the metal by which a large amount of secondary electrons can be obtained when necessary. Further, to detect finer foreign substances or foreign substances having small unevenness, it is desirable to form a finer lattice pattern. Various processing methods such as dry etching or scribing can be used corresponding to required resolution. In this disclosure, "substantially flat" has the meaning which includes fine unevenness to an extent that the unevenness does not influence a trajectory of secondary electrons which is generated from the secondary electron generating member 10 and is directed toward the secondary electron detector 22.

In the above description, the case where the regular lattice structure is arranged on the secondary electron generating member 10 has been explained. However, the lattice structure is not limited to such structure, and may be an irregular lattice structure. Further, the lattice structure may desirably be the structure where a lattice size has a wide distribution. These structures have an advantage of imparting flexibility to the detection of various objects to be inspected having surfaces of complicated shapes.

As the irregular lattice having such structure, a grain boundary of a metal film made of gold particles having large particle size distribution which is formed on a flat substrate by sputtering or the like, a grain boundary of silicon poly-crystals or the like can be conveniently available.

To realize the extremely wide lattice size distribution, it is preferable to use a crystal grain boundary of an amorphous material or a crushed surface of a thin film obtained by thermal or mechanical crushing. For forming the crushed surface, for example, as one example of a method which uses such cracks, a silicon oxide film which is used in a semiconductor process or the like is formed on a flat substrate with a proper film thickness and, thereafter, a rapid change in temperature or a mechanical impact is applied to the silicon oxide film thus intentionally generating cracks in the silicon oxide film, and such cracks are used. In this case, to prevent the crushed film from being peeled off, an ion liquid having extremely high viscosity may be applied to the silicon oxide film by coating thus using the crushed film as a detection surface of the secondary electron generating member 10. Since a surface of the secondary electron generating member 10 is not charged even when the surface is irradiated with a reflection electron RE, the method can be suitably used. Even when an irregular lattice is used, it is easy to identify a corresponding position by overlapping images.

With respect to the secondary electron generating member, it is not always necessary to incorporate only the secondary electron generating member in the single form as shown in FIG. 3 into the inspection device, and the secondary electron generating member may be formed by combining plural kinds of lattice patterns, or the secondary electron generating member may be suitably selected corresponding to a shape or a size of an object to be inspected.

Figure 5:
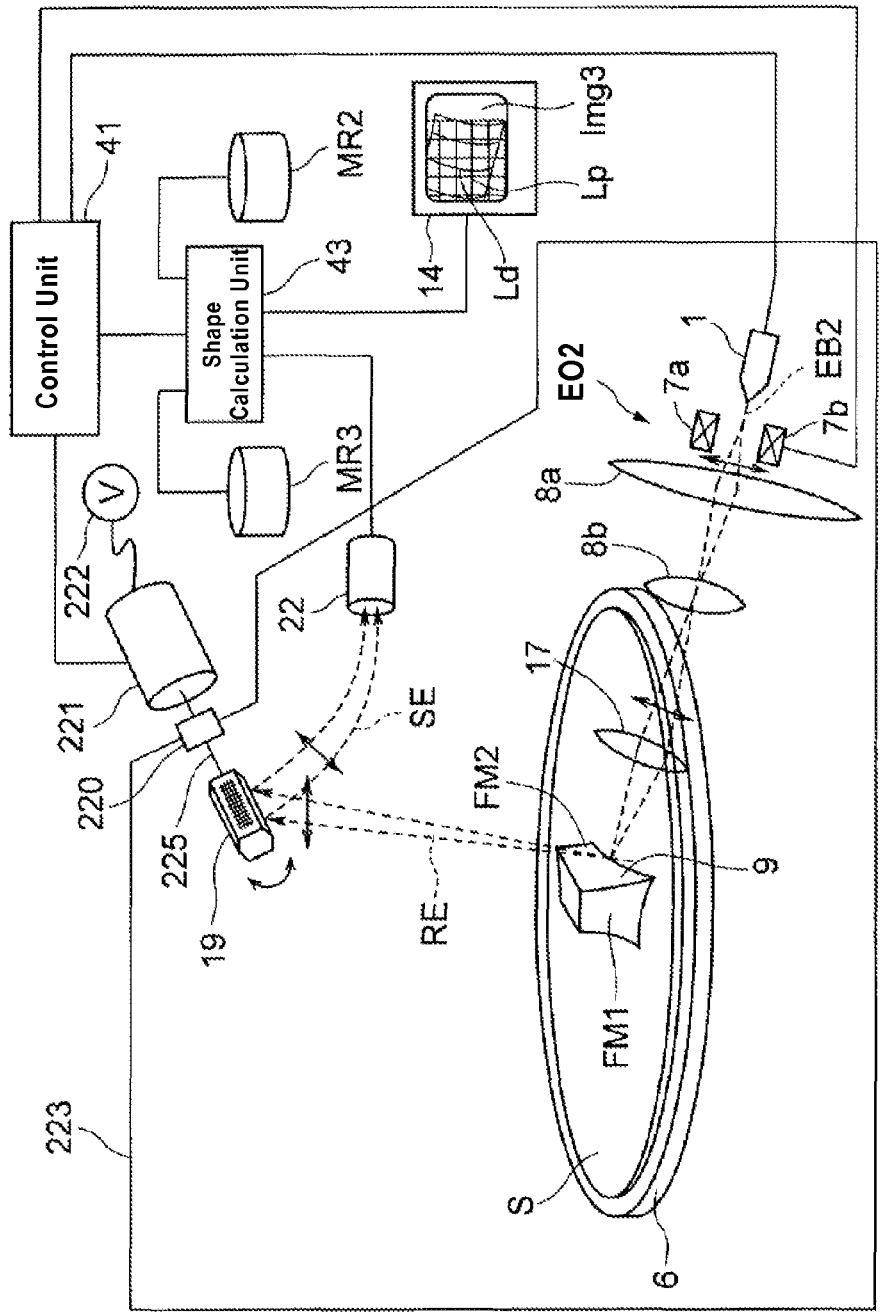
FIG. 5 is a view showing one modification of the inspection device shown in FIG. 3.

FIG. 5 shows one modification of the inspection device shown in FIG. 3. The inspection device shown in FIG. 5 includes a secondary electron generating member 19 where plural kinds of lattice patterns are combined in a selectable manner. The secondary electron generating member 19 is formed of a polygonal column where lattice patterns having different intervals are formed on respective surfaces respectively, and the secondary electron generating member 19 is supported on a rotary shaft 225 inserted along a center axis of the secondary electron generating member 19. An end portion of the rotary shaft 225 on a side opposite to a secondary electron generating member 19 side penetrates a corresponding wall surface of a vacuum chamber 223 and is connected to a rotary shaft of a motor 221. The motor 221 is connected to a drive power source 222 so that electricity is supplied to the motor 221. The motor 221 is also connected to the control unit 41 and is driven in accordance with a control signal transmitted from the control unit 41 so that the secondary electron generating member 19 is rotated such that a reflection electron RE by the specular reflection is incident on the lattice pattern on the desired surface.

A through hole formed in the wall surface into which the rotary shaft 225 is inserted is sealed by a magnetic fluid seal 220 for maintaining a high vacuum in the vacuum chamber 223.

For example, the side surface on which the desired lattice pattern is formed can be easily selected by only rotating the secondary electron generating member 19 having the polygonal column shape and hence, a lattice image having desired detection resolution can be acquired corresponding to a material, a shape, a size or the like of an object to be inspected 9.

In the inspection device shown in FIG. 5, the elements other than the above-mentioned secondary electron generating member 19, rotary shaft 225, motor 221, drive power source 222 and magnetic fluid seal 220 are substantially the same as the corresponding elements of the inspection device shown in FIG. 3.

The above-mentioned explanation with respect to the structure of the secondary electron generating member is not limited to this embodiment, and is also applicable to the third embodiment explained hereinafter in the same manner.

Calculation of an Amount of Distortion by Fitting

An object to be inspected 9 is formed in various shapes and is formed using various materials and hence, there may be a case where an extreme lattice distortion is generated to an extent that an analysis based on the principle of the optical lever does not necessarily lead to an unequivocal solution.

In the shape calculation unit 43 which the inspection device of this embodiment includes, the electric potential distributions of a surface element of an object to be inspected 9 are generated on a computer by fitting a lattice image which is actually acquired and a lattice image which is acquired in advance by simulation, and an amount of distortion of the actually acquired lattice image is calculated based on the acquired electric potential distribution.

To be more specific, various electric potential distributions of a surface element of an object to be inspected 9 are generated on a computer, and lattice images on simulation (hereinafter referred to as "simulation lattice images") containing various distortion patterns are acquired by performing the trajectory calculation when the surface element is irradiated with an electron beam, and the simulation lattice images are stored in memory MR2. In this embodiment, the simulation lattice image corresponds to a second lattice image, for example. As a method of calculating the electric potential distribution on the surface element of the object to be inspected 9, an existing method such as a mirror image method or a charge simulation can be used.

Next, the lattice image Img3 is acquired by actually performing surface scanning of an object to be inspected 9 by an electron beam EB2 using the electro-optical system EO2. Then, the shape calculation unit 43 identifies a simulation lattice image which is the closest to the actual lattice image Img3 among various simulation lattice images stored in the memory MR2, and estimates the electric potential distribution corresponding to the identified lattice image as the electric potential distribution on the actual lattice image Img3. Accordingly, the electric potential distribution on the actual lattice image Img3 can be inductively calculated. The shape calculation unit 43 also calculates an amount of distortion of the actual lattice image Img3 based on the acquired electric potential distribution. Such a fitting function of the shape calculation unit 43 is also operated when necessary in the third embodiment described hereinafter.

According to the inspection device of this embodiment, the facing direction of a surface element is acquired based on the deviation of a landing position of a reflection electron RE from the surface element of an object to be inspected 9 and hence, it is possible to perform the shape inspection of high spatial resolution with high reliability.

(3) Third Embodiment

Figure 6:
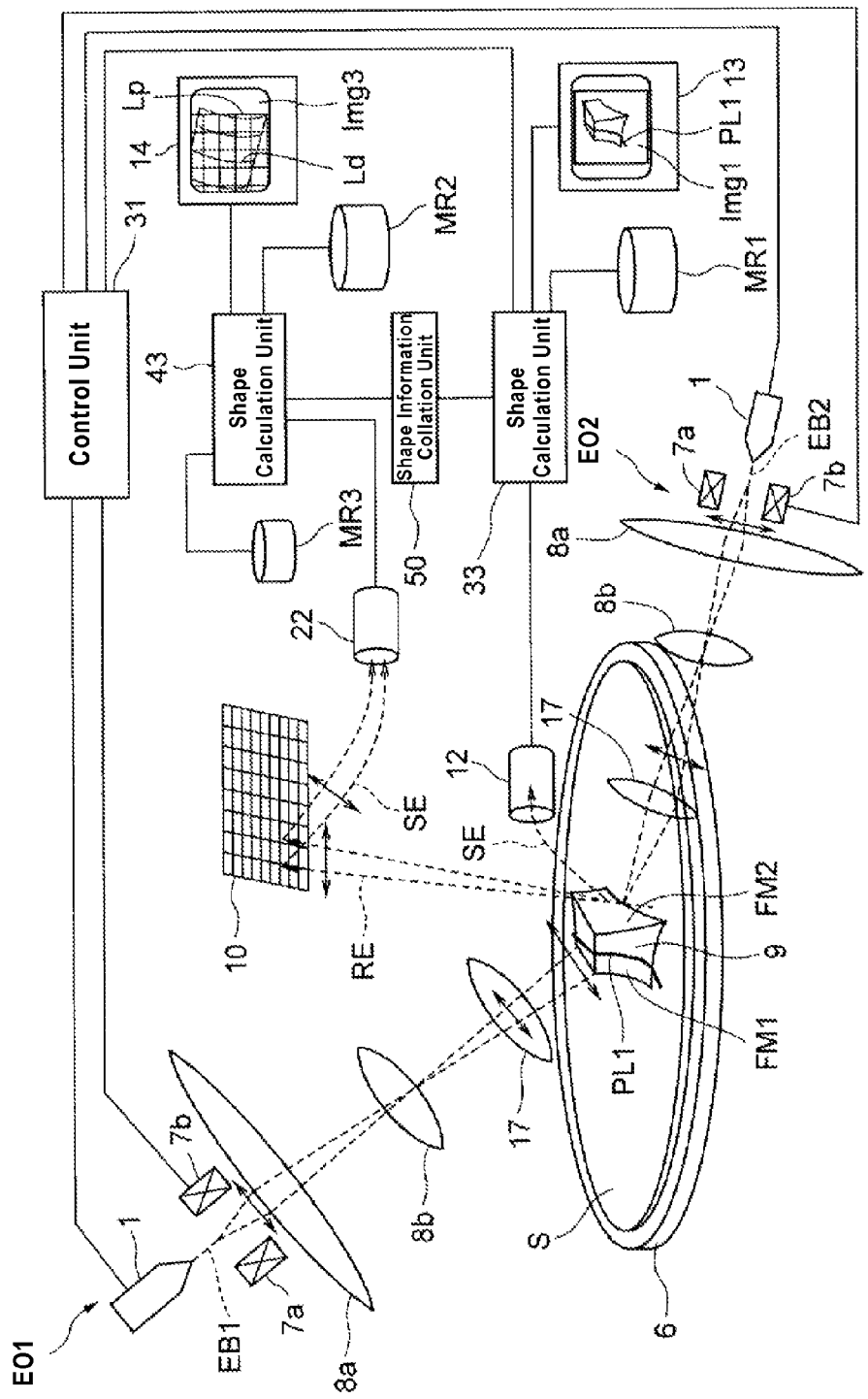
FIG. 6 is a block diagram depicting an inspection device according to a third embodiment.
Figure 7:
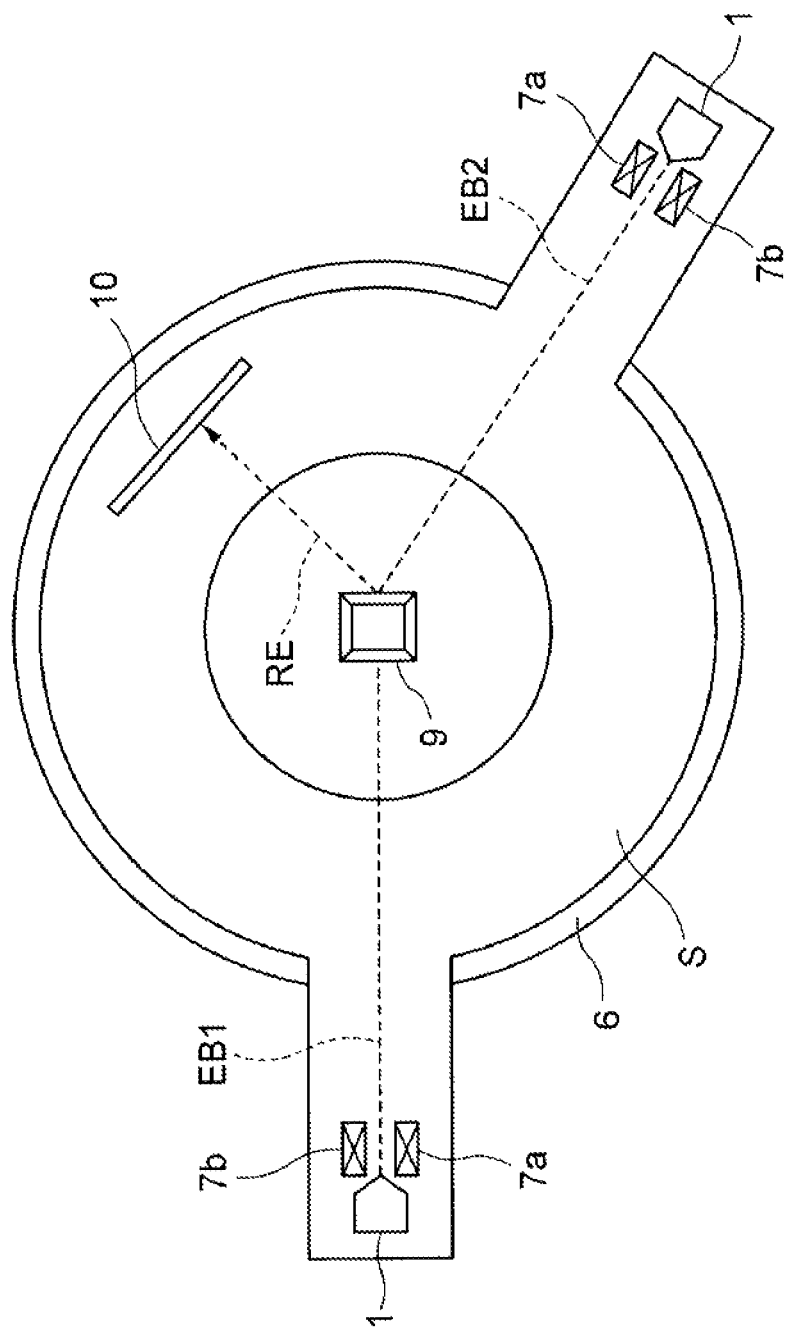
FIG. 7 is a top plan view showing an essential part of the inspection device shown in FIG. 5.

FIG. 6 is a block diagram depicting an inspection device according to the third embodiment. FIG. 7 is a top plan view for explaining the positional relationship among electro-optical systems EO1, EO2, an object to be inspected and a secondary electron generating member 10 in the inspection device shown in FIG. 6. In FIG. 7, electromagnetic lenses 8a, 8b and objective lenses 17 of the respective electro-optical systems EO1, EO2 are omitted.

One of the technical features of the inspection device according to this embodiment lies in that the inspection device shown in FIG. 1 and the inspection device shown in FIG. 3 are combined with each other, and the inspection device includes a shape information collation unit 50 which confirms consistency by comparing information on a three-dimensional shape outputted from the shape calculation unit 33 and information on a three-dimensional shape outputted from the shape calculation unit 43.

In the inspection device shown in FIG. 3, when the whole object to be inspected 9 is charged with an electron beam EB2, a trajectory of the electron beam EB2 changes due to such charging. In this case, when the inspection device shown in FIG. 3 is used alone, it is impossible to distinguish whether the distortion of a lattice is caused by a change in shape or by an effect of charging.

Accordingly, in the inspection device according to this embodiment, an analysis of higher resolution can be realized by selectively observing a portion of an object to be inspected 9 which is irradiated with an electron beam EB1 using an electron beam EB2 and, at the same time, the facing direction of a surface element can be acquired based on the deviation of a landing position of a reflection electron RE from the surface element of the object to be inspected 9, and consistency can be confirmed by comparing shape information acquired separately based on different principles by the shape information collation unit 50 and hence, a more accurate shape information can be obtained compared to the case where each of the inspection techniques is used alone.

According to the inspection device of this embodiment, the consistency is confirmed by collating the shape information acquired by two inspection techniques based on different principles with each other and hence, it is possible to perform the shape inspection of high spatial resolution with high reliability. In this embodiment, the electro-optical systems EO1, EO2 correspond to the first and second electro-optical systems respectively, for example, and the electron beams EB1, EB2 correspond to the first and second electron beams respectively, for example.

(B) Inspection Method (1) First Embodiment

Figure 8:
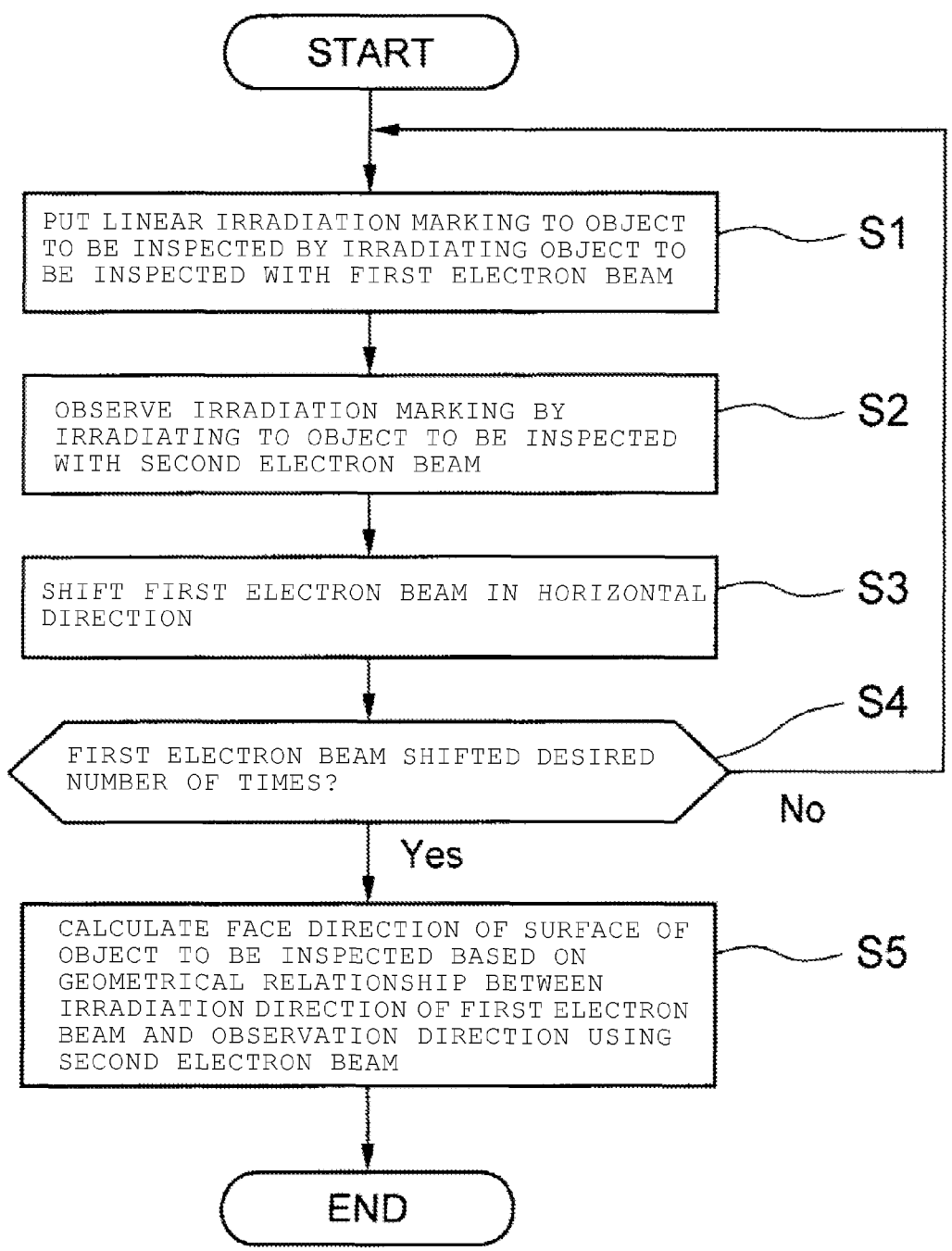
FIG. 8 is a flowchart showing steps of an inspection method according to the first embodiment.

FIG. 8 is a flowchart showing steps of the inspection method according to the first embodiment.

Firstly, an object to be inspected is irradiated with a first electron beam on a substrate, scanning of the object to be inspected is performed in a reciprocating manner in the vertical direction while fixing the position of the object to the inspected in the horizontal direction thus putting a linear irradiation mark on a surface element of the object to be inspected (step S1).

Next, without delay, immediately after the irradiation of the first electron beam or substantially simultaneously with the irradiation of the first electron beam, the object to be inspected is irradiated with a second electron beam for observing the irradiation mark by the first electron beam (step S2).

Subsequently, the first electron beam is shifted in the horizontal direction (step S3). The placing of the linear irradiation mark using the first electron beam and the observation of the irradiation mark using the second electron beam described above are repeated until the number of shifting reaches the desired number (steps S4, S1 to S3).

Finally, a facing direction of a surface of the object to be inspected is calculated based on the geometrical relationship between the irradiation direction of the first electron beam and the observation direction using the second electron beam (step S5).

According to the inspection method of this embodiment, the facing direction of an object to be inspected can be identified only based on the geometrical relationship between an irradiation mark and the observation direction and hence, it is possible to perform the shape inspection of high spatial resolution with high reliability.

(2) Second Embodiment

Figure 9:
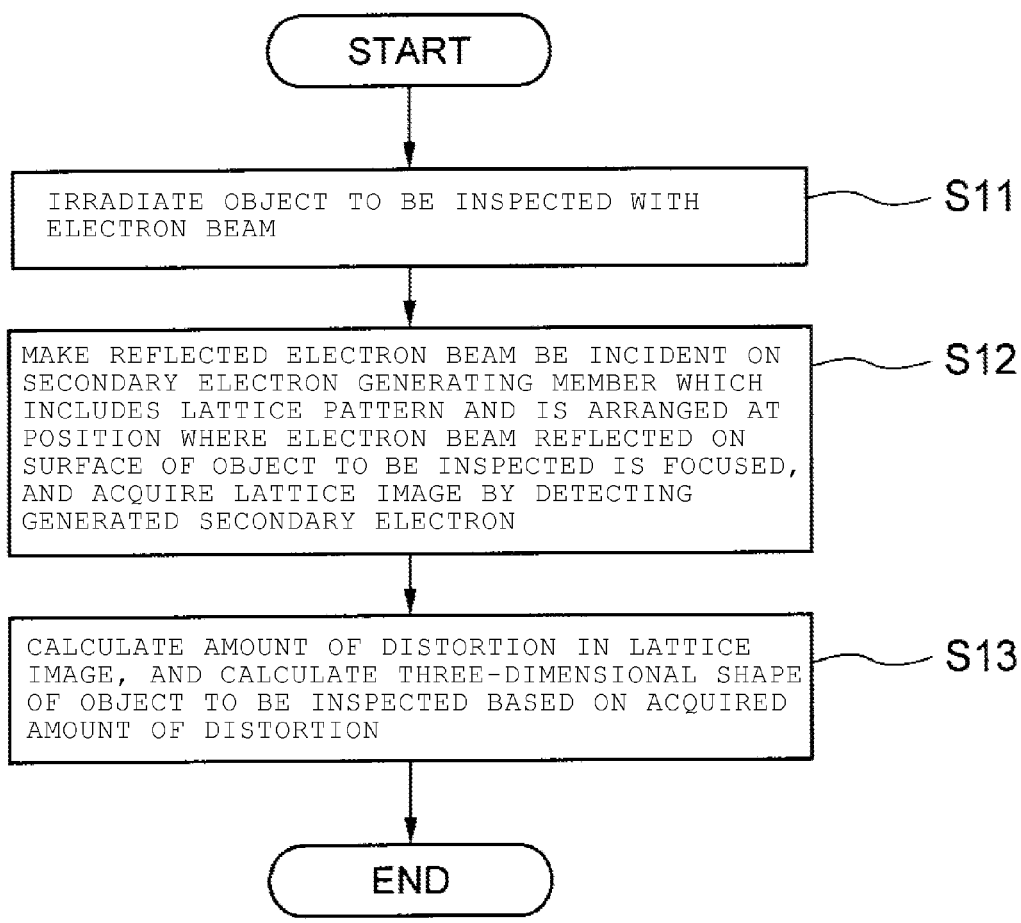
FIG. 9 is a flowchart showing steps of an inspection method according to the second embodiment.

FIG. 9 is a flowchart showing steps of an inspection method according to the second embodiment.

Firstly, an object to be inspected is irradiated with a first electron beam on a substrate (step S11).

Next, a reflection electron which is obtained by the reflection on a surface element of the object to be inspected is made to be incident on a secondary electron generating member which includes a lattice pattern and is arranged at a position where an electron which is reflected on a surface of the object to be inspected is focused, and the generated secondary electron is detected to acquire a lattice image (step S12). The acquired lattice image corresponds to the first lattice image in this embodiment, for example.

Finally, an amount of distortion in the acquired lattice image is calculated, and a three-dimensional shape of the object to be inspected is calculated based on the acquired amount of distortion (step S13).

When a gradient exists in a surface element of an object to be inspected, the deviation is generated between the emission direction of a reflection electron RE and the emission direction of the reflection electron RE from a flat surface element due to such a gradient and hence, a landing position on an detection surface of the secondary electron generating member becomes deviated. The deviation in landing position is calculated using the principle of optical lever, and an amount of distortion in a lattice image can be calculated by backwardly calculating the calculation result.

There may be a case where an extreme lattice distortion is generated to an extent that an analysis based on the principle of the optical lever does not lead to an unequivocal solution depending on a shape or a material of an object to be inspected. In such a case, the electric potential distribution on a surface element of the object to be inspected is calculated by fitting simulation lattice images including various distortion patterns which are acquired in advance and an actually acquired lattice image, and the amount of distortion of the actually acquired lattice image may be calculated based on the acquired electric potential distribution.

The simulation lattice images can be acquired by generating various electric potential distributions on surface elements of an object to be inspected on a computer and by performing a trajectory calculation when the surface is irradiated with an electron beam.

According to the inspection method of this embodiment, the facing direction of a surface element is obtained based on the deviation of a landing position of a reflection electron from a surface element of an object to be inspected and hence, it is possible to perform the shape inspection of high spatial resolution with reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inspection device comprising:
a first electro-optical system configured to irradiate an object to be inspected with a first electron beam to cause an irradiation mark to be placed on the object to be inspected;
a second electro-optical system configured to irradiate the object to be inspected with a second electron beam;
a first detector configured to detect a secondary electron generated from the object to be inspected in response to the irradiation by the second electron beam, and output a first signal based on the irradiation mark; and
a shape calculation unit configured to calculate a three-dimensional shape of the object to be inspected based on the first signal, an irradiation direction of the first electron beam, and an irradiation direction of the second electron beam.

2. The device according to claim 1, wherein the first electro-optical system comprises beam deflectors configured to shift the irradiation direction of the first electron beam.

3. The device according to claim 2, further comprising:
a control unit configured to generate a control signal to the beam deflectors to shift the irradiation direction of the first electron beam.

4. The device according to claim 3, wherein the second electro-optical system comprises beam deflectors configured to shift the irradiation direction of the second electron beam, and the control unit is further configured to generate a control signal to the beam deflectors of the second electro-optical system to shift the irradiation direction of the second electron beam.

5. The device according to claim 1, wherein the shape calculation unit is configured to produce an image of the irradiation mark and calculate a facing direction of a first surface of the object relative to a second surface of the object based on geometrical features of the image of the irradiation mark, the irradiation direction of the first electron beam, and the irradiation direction of the second electron beam.

6. The device according to claim 5, further comprising:
a substantially flat member which is arranged at a position where the second electron beam which is reflected on the surface of the object to be inspected is focused;
a second detector configured to detect a secondary electron generated when the reflected electron beam becomes incident on the substantially flat member and output a second signal; and
a shape information collation unit, wherein
the shape calculation unit is further configured to acquire a first lattice image by processing the second signal, calculate an amount of distortion in the first lattice image relative to a reference lattice image, and calculate the three-dimensional shape from the amount of distortion, and
the shape information collation unit is configured to collate information on the three-dimensional shape acquired based on the geometrical features of the image of the irradiation mark and the three-dimensional shape acquired based on the amount of distortion.

7. The device according to claim 6, wherein the shape calculation unit is configured to perform fitting of the first lattice image onto a plurality of second lattice images prepared in advance and calculates an amount of distortion in the first lattice image based on the fitting results.

8. The device according to claim 6, wherein the flat member has a first lattice pattern and is mounted on a rotatable device with other flat members having different lattice patterns.

9. An inspection device comprising:
a first electro-optical system configured to irradiate an object to be inspected with a first electron beam;
a substantially flat member which is arranged at a position where the first electron beam which is reflected on a surface of the object to be inspected is focused;
a detector configured to detect a secondary electron generated when the reflected first electron beam becomes incident on the substantially flat member and output a first signal; and
a shape calculation unit configured to acquire a first lattice image by processing the first signal, calculate an amount of distortion in the first lattice image relative to a reference lattice image, and calculate a three-dimensional shape of the object to be inspected from the amount of distortion.

10. The device according to claim 9, wherein the shape calculation unit is configured to perform fitting of the first lattice image to a plurality of second lattice images prepared in advance, and calculate an amount of distortion in the first lattice image based on the fitting results.

11. The device according to claim 10, wherein the second lattice images are prepared in advance through simulation.

12. The device according to claim 9, wherein the flat member has a first lattice pattern and is mounted on a rotatable device with other flat members having different lattice patterns.

13. An inspection method comprising:
marking an object to be inspected by irradiating the object with a first electron beam;
irradiating the object to be inspected with a second electron beam;
detecting a secondary electron generated from the object to be inspected in response to the irradiation by the second electron beam, and outputting a first signal based on the irradiation mark; and
calculating a three-dimensional shape of the object to be inspected based on the first signal, an irradiation direction of the first electron beam, and an irradiation direction of the second electron beam.

14. The method according to claim 13, further comprising: shifting the irradiation direction of the first electron beam.

15. The device according to claim 13, further comprising:
generating an image of the irradiation mark;
calculating a facing direction of a first surface of the object relative to a second surface of the object based on geometrical features of the image of the irradiation mark, the irradiation direction of the first electron beam, and the irradiation direction of the second electron beam.

16. The method according to claim 13, further comprising:
processing a second signal to produce a first lattice image, the second signal being generated when the second electron beam reflects off a surface of the object to be inspected and becomes incident on a flat member having a first lattice pattern formed thereon;
calculating an amount of distortion in the first lattice image relative to a reference lattice image; and
calculating the three-dimensional shape of the object to be inspected from the amount of distortion.

17. The method according to claim 16, further comprising:
collating information on the three-dimensional shape acquired based on the geometrical features of the image of the irradiation mark and the three-dimensional shape acquired based on the amount of distortion.

18. The method according to claim 16, further comprising:
performing fitting of the first lattice image onto a plurality of second lattice images prepared in advance; and
calculating an amount of distortion in the first lattice image based on the fitting results.

19. The method according to claim 18, wherein the second lattice images are prepared in advance through simulation.

20. The method according to claim 16, wherein the flat member has a first lattice pattern and is mounted on a rotatable device with other flat members having different lattice patterns.

* * * * *